United States Patent [19]
Watanabe

[11] Patent Number: 5,838,091
[45] Date of Patent: Nov. 17, 1998

[54] SURFACE ACOUSTIC WAVE DEVICE INCLUDING IDT ELECTRODE HAVING SOLID ELECTRODE PORTION AND SPLIT ELECTRODE PORTION

[75] Inventor: Toru Watanabe, Nagaokakyo, Japan

[73] Assignee: Murata Manufacturing Co., Ltd., Kyoto-fu, Japan

[21] Appl. No.: 625,592

[22] Filed: Apr. 3, 1996

[30] Foreign Application Priority Data

Apr. 4, 1995 [JP] Japan .................................. 7-078882

[51] Int. Cl.⁶ .................................................. H01L 41/08
[52] U.S. Cl. .................................. 310/313 C; 310/313 B
[58] Field of Search .......................... 310/313 B, 313 C; 333/150–155, 193–196

[56] References Cited

U.S. PATENT DOCUMENTS

| | | |
|---|---|---|
| 3,670,186 | 6/1972 | Hobden et al. .................... 310/313 C |
| 3,727,155 | 4/1973 | De Vries .......................... 310/313 B X |
| 3,792,381 | 2/1974 | Bristol ............................. 310/313 B X |
| 3,979,702 | 9/1976 | Hunsinger et al. .................... 310/193 |
| 4,005,378 | 1/1977 | Slobodnik, Jr. et al. ......... 310/313 C X |
| 4,143,340 | 3/1979 | Hunsinger ........................... 333/151 |
| 4,162,465 | 7/1979 | Hunsinger et al. .................... 333/151 |
| 4,866,325 | 9/1989 | Kodama et al. .................... 310/313 B |
| 5,073,763 | 12/1991 | Wright ................................. 333/193 |

*Primary Examiner*—Mark O. Budd
*Attorney, Agent, or Firm*—Ostrolenk, Faber, Gerb & Soffen, LLP

[57] ABSTRACT

A surface acoustic wave device achieving improved insertion loss and fraction defective without lowering the TTE level includes an IDT electrode located on a piezoelectric substrate. The IDT electrode includes a solid electrode portion and a split electrode portion continuously formed at an end of the solid electrode portion in the propagating direction of a surface acoustic wave and having an electrode finger width of about $\lambda/8$ wherein $\lambda$ is the wavelength of the surface acoustic wave.

8 Claims, 4 Drawing Sheets

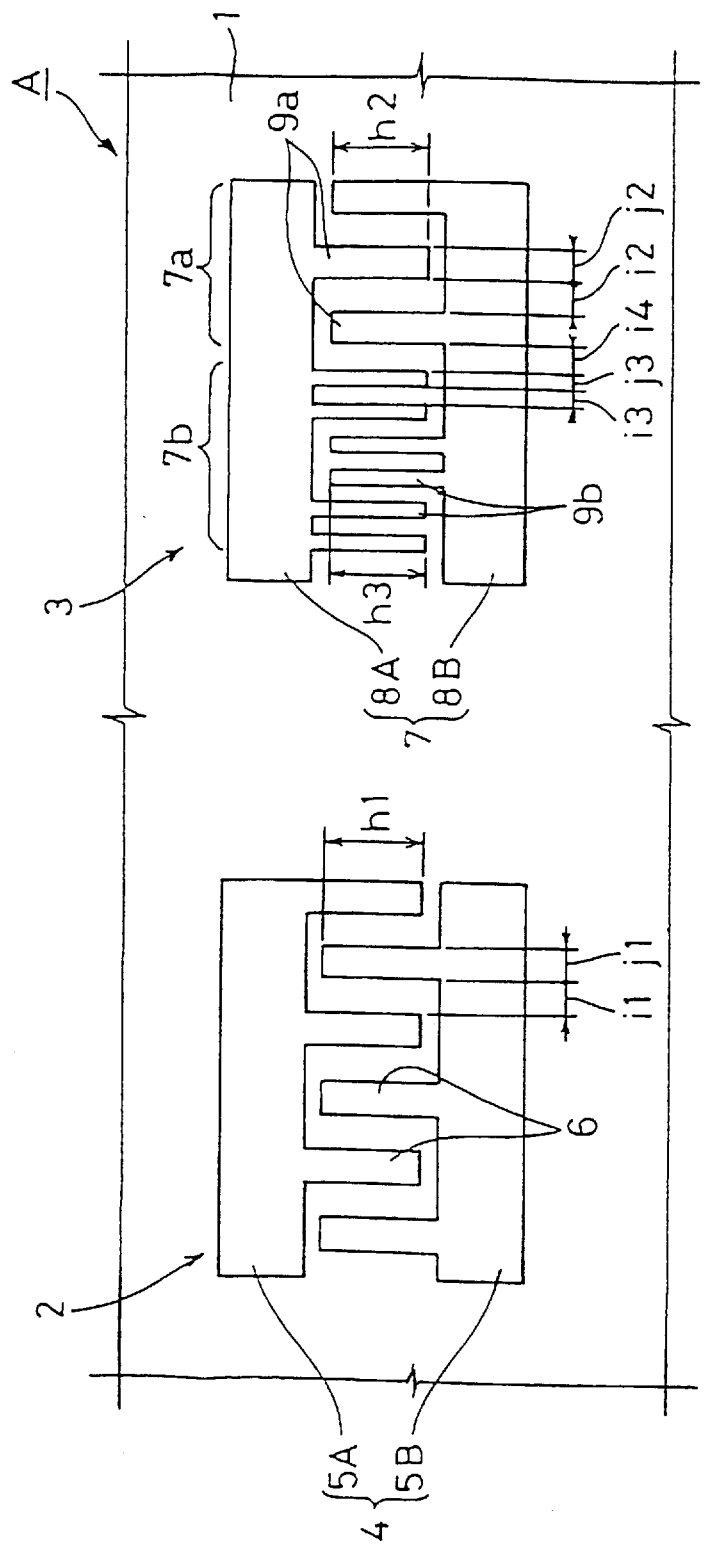

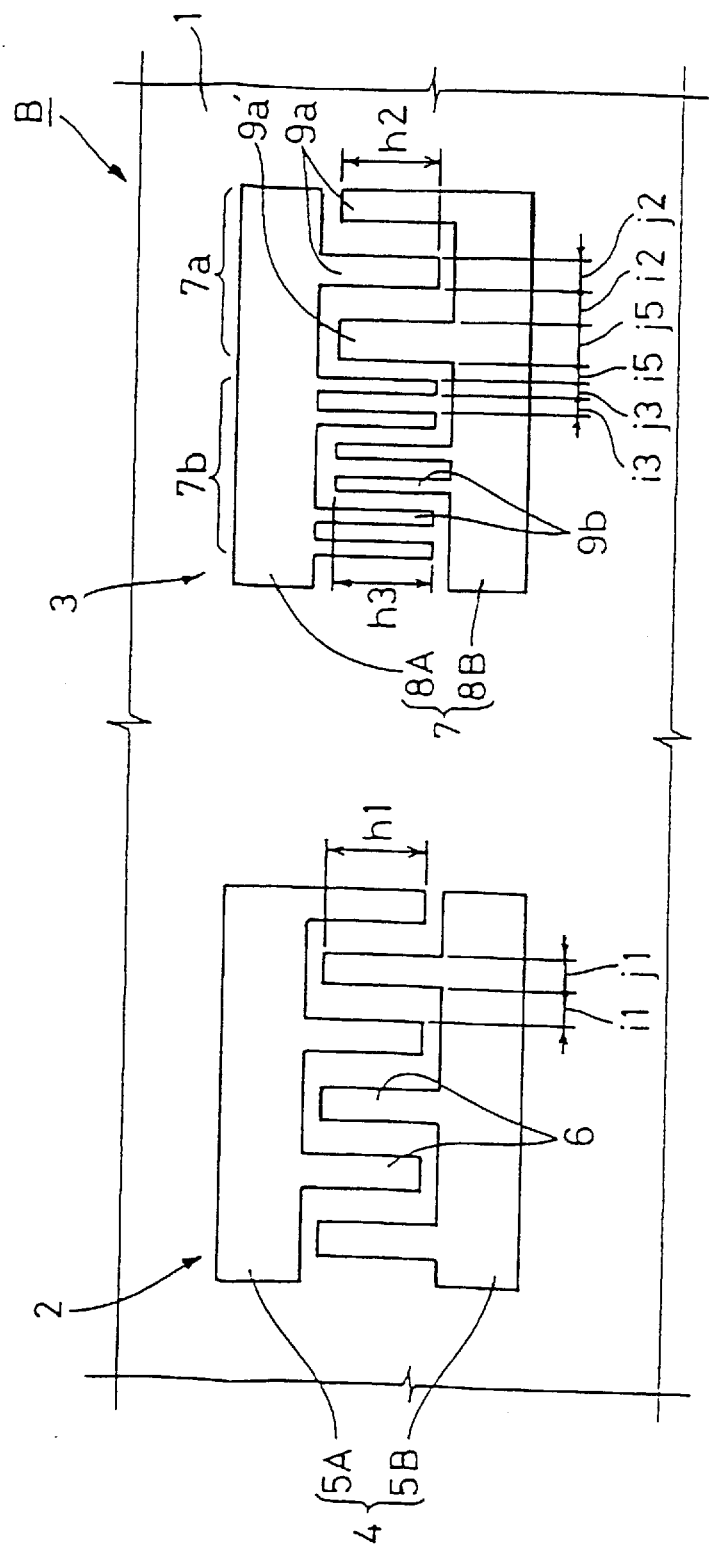

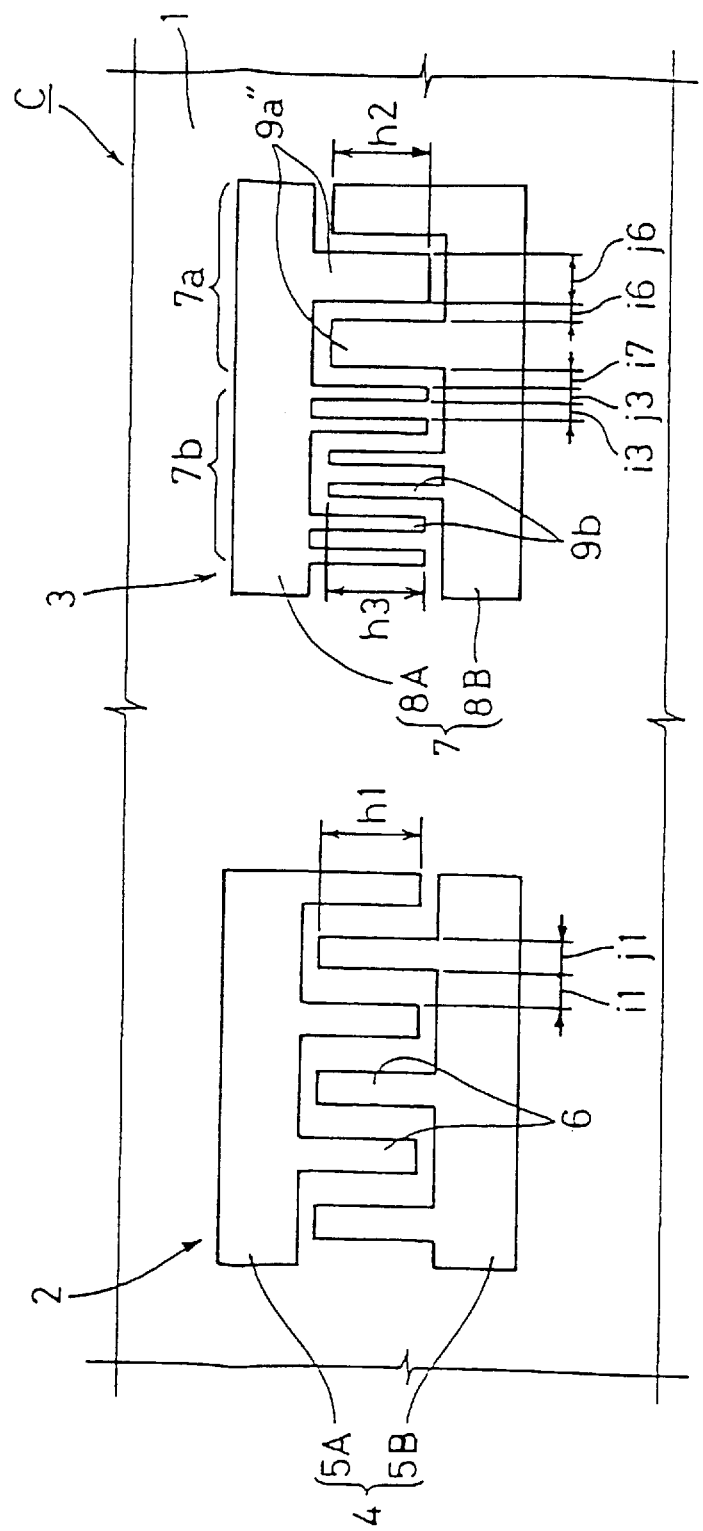

SURFACE ACOUSTIC WAVE DEVICE INCLUDING IDT ELECTRODE HAVING SOLID ELECTRODE PORTION AND SPLIT ELECTRODE PORTION

BACKGROUND OF THE INVENTION

1. Field of the Invention

The present invention relates to a surface acoustic wave device which receives and excites a surface acoustic wave.

2. Description of the Related Arts

A general type of surface acoustic wave device has a surface acoustic wave transducer in which an interdigital transducer, hereinafter referred to as IDT electrode, is formed on a piezoelectric substrate. Normally, a pair of surface acoustic wave transducers are respectively provided on the excitation side and the receiving side, and arranged in parallel on a single piezoelectric substrate in the propagating direction of the surface acoustic wave.

The IDT electrode is, as shown in FIGS. 4(a) and 4(b), formed by meshing electrode fingers 21 of a pair of comb-shaped electrodes 20A and 20B disposed opposite to each other. FIG. 4(a) illustrates a split IDT electrode 22 in which the electrode fingers 21 are meshed two by two (a width j10 of each of the electrode fingers 21 is $\lambda/8$, wherein $\lambda$ indicates the wavelength of the surface acoustic wave), and FIG. 4(b) illustrates a solid IDT electrode 23 in which the electrode fingers 21 are meshed one, by one wherein a width j11 of each of the electrode fingers 21 is $\lambda/4$.

In a conventional surface acoustic wave device like a transversal filter, in order to reduce Triple Transit Echo (abbreviated to "TTE" hereinafter), the surface acoustic wave transducer on one of the excitation and receiving sides is a split IDT electrode 22, and the surface acoustic wave transducer on the other side is a solid IDT electrode 23.

However, in such a conventional surface acoustic wave device using the split IDT electrode 22 as one of the surface acoustic wave transducers, short circuits and cutoffs are likely to occur during production. Although the IDT electrodes are formed on the piezoelectric substrate by photolithography, since the electrode finger width j10 of the split IDT electrode 22 is $\lambda/8$, which is half the electrode finger width j11 ($\lambda/4$) of the solid IDT electrode 23, the production of the split IDT electrode 22 is extremely difficult, and there is a high probability that a production failure will be caused by a short circuit, a cutoff and the like.

Furthermore, static electricity produced in the surface acoustic wave device during or after production is likely to cause electrostatic breakdown. In the IDT electrode formed by the comb-shaped electrodes 20A and 20B meshed with each other, static electricity produced on the piezoelectric substrate is likely to be discharged between the opposed comb-shaped electrodes 20A and 20B due to the structure thereof. If static discharge occurs, the electrode fingers 21 in the discharge portion are damaged. Such discharge tends to occur more frequently as the clearance between the opposed comb electrodes 20A and 20B becomes narrower. In the split IDT electrode 22, the electrode finger width j10 is small and the interval between the meshing electrode fingers 21 of the comb-shaped electrodes 20A and 20B is also narrow, with the result that a discharge is likely to occur between the comb-shaped electrodes 20A and 20B. In addition, since each electrode finger 21 increases the resistance to discharge breakdown as the width thereof increases, and the split IDT electrode 22, whose electrode finger width is half that of the solid IDT electrode 23, cannot be expected to be sufficiently resistant to discharge breakdown.

A large insertion loss is a further problem. It is well known that the insertion loss of the surface acoustic wave device increases as the electromechanical coupling coefficient $k^2$ of the IDT electrode decreases. The electromechanical coupling coefficient $k^2$ of the split IDT electrode 22 is, as well known, 75% of that of the solid IDT electrode 23, and the insertion loss is thereby increased.

SUMMARY OF THE INVENTION

The preferred embodiments of the present invention overcome the problems of the prior art described above by decreasing the insertion loss of a surface acoustic wave device and the number of defective devices without lowering the TTE level.

More specifically, the preferred embodiments of the present invention provide a surface acoustic wave device comprising an IDT electrode formed on a piezoelectric substrate and including a solid electrode portion and a split electrode portion, the split electrode portion being continuously formed at an end of the solid electrode portion in the propagating direction of a surface acoustic wave and having an electrode finger width of about $\lambda/8$ ($\lambda$=the wavelength of the surface acoustic wave).

It is preferable that the clearance between the split electrode portion and the solid electrode portion be substantially equal to $\lambda/8$ and that an electrode finger at an end of the solid electrode portion closest to the electrode clearance has a width of about $5\lambda/16$. Furthermore, it is preferable that the electrode finger width of the solid electrode portion is substantially equal to about $3\lambda/8$.

Other features and advantages of the present invention will become apparent from the following description of the preferred embodiments of the invention which refers to the accompanying drawings.

BRIEF DESCRIPTION OF THE DRAWINGS

FIG. 1 is a plan view showing the structure of a surface acoustic wave device according to a first preferred embodiment of the present invention;

FIG. 2 is a plan view showing the structure of a surface acoustic wave device according to a second preferred embodiment of the present invention;

FIG. 3 is a plan view showing the structure of a surface acoustic wave device according to a third preferred embodiment of the present invention.

DESCRIPTION OF PREFERRED EMBODIMENTS

Figure 4A:
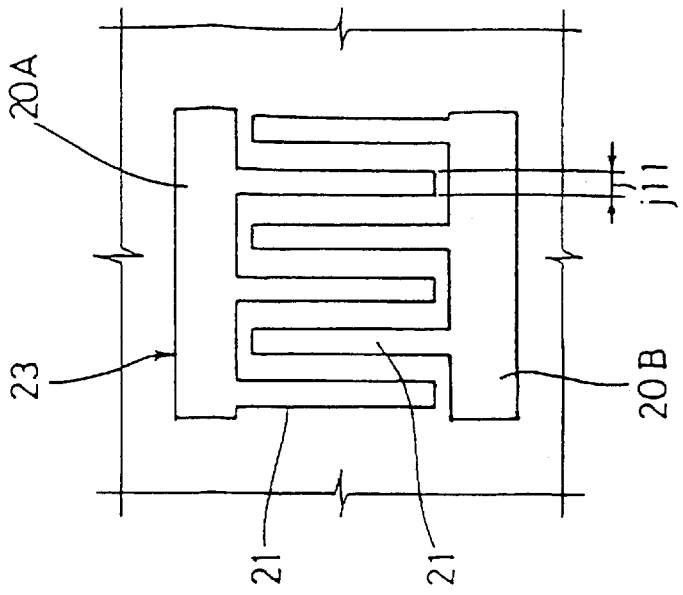
FIG. 4 is a plan view showing the structure of the prior art.
Figure 4B:
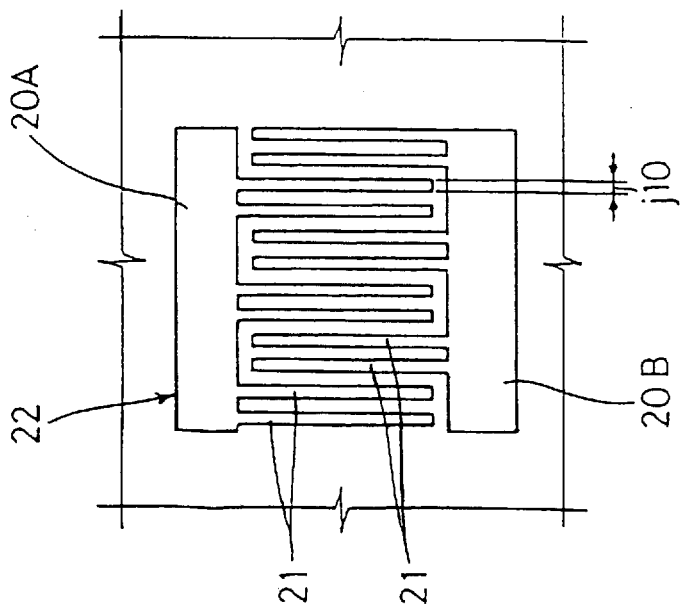

Preferred embodiments of the present invention will be described in detail below with reference to the attached drawings.

FIG. 1 is a plan view of a surface acoustic wave device A according to a first preferred embodiment of the present invention. In this surface acoustic wave device A, a pair of surface acoustic wave transducers 2 and 3 are provided on the surface of a piezoelectric substrate 1. The piezoelectric substrate 1 preferably comprises, for example, a borosilicate glass substrate with a zinc oxide (ZnO) film of 25 $\mu$m in thickness formed on the surface thereof. The surface acoustic wave transducers 2 and 3 are respectively used for excitation and receiving of a surface acoustic wave, and arranged in parallel on the piezoelectric substrate 1 along the propagating direction of the surface acoustic wave.

An IDT electrode 4, forming the surface acoustic wave transducer 2, is in the form of a normal-type solid electrode.

The IDT electrode 4 includes comb-shaped electrodes 5A and 5B disposed opposite to each other, and electrode fingers 6 of the comb-shaped electrodes 5A and 5B are meshed one by one. Furthermore, a mesh depth h1 of the electrode fingers 6 is preferably fixed (for example, 1000 μm). A width j1 and an interval i1 of the electrode fingers 6 are preferably set at $\lambda/4$ ($\lambda$ indicates the wavelength of the surface acoustic wave).

An IDT electrode 7 forming the other surface acoustic wave transducer 3 is preferably formed by connecting a normal-type solid electrode portion 7a and a normal-type split electrode portion 7b. The IDT electrode 7 includes comb-shaped electrodes 8A and 8B disposed opposite to each other, and electrode fingers thereof are meshed alternately. Electrode fingers 9a, which are positioned on the end portion of the IDT electrode 7 located farthest away from the above-mentioned surface acoustic wave transducer 2, are meshed one by one to form the solid electrode portion 7a. A mesh depth h2 of the electrode fingers 9a in the solid electrode portion 7a is preferably fixed at the same value as the above mesh depth h1 (for example, 1000 μm). Furthermore, a width j2 and an interval i2 of the electrode fingers 9a are preferably set at $\lambda/4$ ($\lambda$=the wavelength of the surface acoustic wave).

The other electrode fingers, that is, electrode fingers 9b positioned adjacent to the above-mentioned surface acoustic wave transducer 2 are meshed alternately two by two to form the split electrode portion 7b. A mesh depth h3 of the electrode fingers 9b in the split electrode portion 7b is preferably fixed at the same value as the above mesh depth h1 (for example, 1000 μm). Furthermore, a width j3 and an interval i3 of the electrode fingers 9b are preferably set at $\lambda/8$ ($\lambda$=the wavelength of the surface acoustic wave).

The solid electrode portion 7a and the split electrode portion 7b are formed on the piezoelectric substrate 1 at an area ratio of about 1 to 1, and an electrode finger interval i4 on the border therebetween is preferably set at $3\lambda/16$. This setting is made to maintain the continuity of the surface acoustic wave between the solid electrode portion 7a and the split electrode portion 7b.

FIG. 2 is a plan view of a surface acoustic wave device B according to a second preferred embodiment of the present invention. This surface acoustic wave device B basically has a similar structure to the first preferred embodiment. The components which are the same as and similar to those in the first preferred embodiment are denoted by the same numerals, and a detailed description thereof is omitted. The surface acoustic wave device B differs from the first preferred embodiment in the following structure. Although an electrode finger width j2 of a solid electrode portion 7a in one surface acoustic wave transducer 3 is preferably set to be $\lambda/4$, only an electrode finger 9a' at the end of the IDT electrode 7 closest to a split electrode portion 7b has an electrode finger width j5 of $5\lambda/16$. Furthermore, an electrode finger interval i5 on the border between the solid electrode portion 7a and the split electrode portion 7b is preferably set at $\lambda/8$ in the same manner as an electrode finger interval i3 of the split electrode portion 7b.

Only the electrode finger width j5 of the electrode finger 9a' is set at $5\lambda/16$ for the following reason. If it is assumed that the electrode finger width j5 of the electrode finger 9a' is taken as $\lambda/4$, the midpoint of the electrode finger interval i5 between the split electrode portion 7b and the solid electrode portion 7a deviates by $\lambda/32$ from the position where it should be, that is, the position best-suited for excitation and receiving of surface acoustic waves, toward the solid electrode portion 7a, which lowers excitation and receiving efficiencies and increases the insertion loss. In order to compensate for the deviation, the electrode finger width j5 of the electrode finger 9a' is widened to $5\lambda/16$.

FIG. 3 is a plan view of a surface acoustic wave device C according to a third preferred embodiment of the present invention. This surface acoustic wave device C basically has a similar structure to the first preferred embodiment. The components that are the same as and similar to those in the first preferred embodiment are denoted by the same numerals, and a detailed description thereof is omitted. The surface acoustic wave device C differs from the first preferred embodiment in the following structure. Each of the electrode fingers 9a'' in a solid electrode portion 7a preferably has an electrode finger width j6 of $3\lambda/8$. An electrode finger interval i6 between the electrode fingers 9a'' and an electrode finger interval i7 on the border between the solid electrode portion 7a and a split electrode portion 7b are preferably $\lambda/8$ which is the same as an electrode finger interval i3 of the split electrode portion 7b.

The electrode finger width j6 is set at $3\lambda/8$ for the following reason. It is well known that a surface acoustic wave produced between electrode fingers at different potentials is made proportional to the strength of an electric field added between the electrodes by the piezoelectric action and reaction. The same is true for a received surface acoustic wave. Furthermore, it is also well known that the strength of an electric field added between electrode fingers at different potentials is proportional to the potential difference and inversely proportional to the clearance between the electrode fingers.

Since the solid electrode portion 7a and the split electrode portion 7b are both components of comb-shaped electrodes 8A and 8B and connected to each other, the potential difference between the comb-shaped electrodes 8A and 8B is constant wherever the solid electrode portion 7a and the split electrode portion 7b are formed. However, since the solid electrode portion 7a and the split electrode portion 7b have different electrode finger intervals (i6≠i3), the strength of the electric field added between the comb-shaped electrodes 8A and 8B differs between the forming position of the solid electrode portion 7a and the forming position of the split electrode portion 7b. Such nonuniformity of the electric field strength causes distortion of the waveform and increase of the insertion loss.

Accordingly, this preferred embodiment compensates for the above nonuniformity of the electric field strength by setting the electrode finger width j6 of the electrode fingers 9a'' in the solid electrode portion 7a at $3\lambda/8$ which is wider than other electrode fingers.

Table 1 gives a comparison of examples made in accordance with the surface acoustic wave devices A, B and C described above and a conventional surface acoustic wave device F on the basis of the TTE level, the insertion loss and the fraction defective (the ratio of defectives, which result from short circuits, cutoffs and the like in the photolithographic process and electrostatic breakdown before and after production, to all pieces). The examples of the surface acoustic wave devices A, B, C and F were each comprised of a piezoelectric substrate 1 made of a borosilicate glass substrate with a zinc oxide (ZnO) film of 25 μm in thickness formed thereon, and IDT electrodes 4 and 7 formed on the piezoelectric substrate 1 which have a center frequency of 41 MHz and IDT electrode mesh depths h1, h2 and h3 (1000 μm) and include 37 pairs of electrode fingers. These surface acoustic wave devices A, B, C and F were tested with a circuit having a resistance of 330 Ω and an inductance of 1.2 μH on the input side and a resistance of 330 Ω and a capacitance of 5.1 pF on the output side.

TABLE 1

| Defective Prior Art F | Insertion Loss 13.2 dB | TTE Level 41 dB | Fraction Datum |
| --- | --- | --- | --- |
| Embodiment A | 13.0 dB | 41 dB | 27% Decreased |
| Embodiment B | 12.8 dB | 41 dB | 27% Decreased |
| Embodiment C | 12.4 dB | 41 dB | 10% Decreased |
| Embodiment D | 13.0 dB | 41 dB | 21% Decreased |
| Embodiment E | 13.0 dB | 39 dB | 27% Decreased |

This table reveals that the surface acoustic wave devices A, B and C improved the characteristics without making the TTE level lower than the prior art F. Specifically, the surface acoustic wave device A decreased the insertion loss by 0.2 dB and the fraction defective by 27%. This result is achieved because the area ratio of the split electrode portion to the entire IDT electrode is half of that of the prior art F.

The surface acoustic wave device B decreased the insertion loss by 0.4 dB and the fraction defective by 27%. This also is because the area ratio of the split electrode portion to the entire IDT electrode is half of that of the prior art F. The insertion loss is 0.2 dB lower than that of the surface acoustic wave device A because the midpoint of the electrode finger interval i5 between the split electrode portion 7b and the solid electrode portion 7a is set in a desired location by widening the electrode finger width j5 to 5λ/16.

The surface acoustic wave device C decreased the insertion loss by 0.8 dB and the fraction defective by 10%. Such a substantial decrease of the insertion loss by 0.8 dB results for the following reason. Since all the electrode finger intervals are the same, the strength of the electric field added between the comb-shaped electrodes 8A and 8B does not differ between the forming position of the solid electrode portion 7a and the forming position of the split electrode portion 7b, and the entire surface acoustic wave device C is in balance.

Although the electrode finger interval i6 of the solid electrode portion 7a in the surface acoustic wave device C is the same narrow value of λ/8 as the electrode finger interval i3 of the split electrode portion 7b, the decrease rate of the fraction defective is 10% which is relatively high. This result is achieved because of the wide electrode finger width j6 of the solid electrode portion 7a and the high resistance to discharge breakdown.

Furthermore, although not shown in Table 1, the above surface acoustic wave device A was constructed to have a center frequency of 36 MHz and include 8 pairs of electrode fingers, and tested with a circuit having a resistance of 330 Ω and an inductance of 1.2 μH on the input side and a resistance of 330 Ω and a capacitance of 5.1 pF on the output side. The test confirmed that the insertion loss can be decreased by 0.9 dB without lowering the TTE level.

Although the area ratio of the solid electrode portion 7a to the split electrode portion 7b is about 1 to 1 in the above description of the preferred embodiments, the preferred embodiments of the present invention are not limited to such a structure. In short, it is only necessary that one of the surface acoustic wave transducers partially includes the split electrode portion 7b. Accordingly, a surface acoustic wave device D, whose area ratio of the solid electrode portion 7a to the split electrode portion 7b is set at about 2 to 1, is also given as an example, and the measurement result of characteristics thereof is shown in Table 1. Although Table 1 shows only the measurement result of the surface acoustic wave device D which is different from the surface acoustic wave device A in the 2:1 area ratio of the solid electrode portion 7a to the split electrode portion 7b, it is needless to say that similar results can be obtained even when the area ratio of the solid electrode portion 7a to the split electrode portion 7b in the other surface acoustic wave devices B and C is changed to about 2 to 1.

As Table 1 reveals, the surface acoustic wave device D, whose area ratio of the solid electrode portion 7a to the split electrode portion 7b is 2 to 1, decreased the insertion loss by 0.2 dB and the fraction defective by 21% as compared with the prior art F.

Furthermore, in the above preferred embodiments, the split electrode portion 7b is located on the end portion of the IDT electrode 7 that is closer to the surface acoustic wave transducer 4, and the solid electrode portion 7a is located on the opposite end portion. However, to the contrary, the solid electrode portion 7a may be located on the end portion of the IDT electrode 7 that is closer to the surface acoustic wave transducer 4 and the split electrode portion 7b may be located on the opposite end portion. The measurement result of the characteristics of a surface acoustic wave device E having such a structure is also shown in Table 1. Although the solid electrode portion 7a and the split electrode portion 7b in the surface acoustic wave device E are placed in the opposite order to the surface acoustic wave device A, it is needless to say that similar measurement results can be obtained by structuring the other surface acoustic wave devices B and C in the same manner as above.

As Table 1 reveals, although the TTE level of the surface acoustic wave device E is a little lower than that of the prior art F, the insertion loss and the fraction defective thereof were improved by 0.2 dB and 27%, respectively.

Although both the IDT electrodes 4 and 7 are of the normal type in the above-mentioned preferred embodiments, it is needless to say that the preferred embodiments of the present invention are also applicable to a surface acoustic wave device equipped with an IDT electrode whose mesh depth is weighted, and a surface acoustic wave device in which the electrode period is changed and the characteristics are weighted.

As described above, according to the preferred embodiments of the present invention, it is possible to decrease the insertion loss and the fraction defective without lowering the TTE level.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a piezoelectric substrate;
   an interdigital transducer electrode disposed on said piezoelectric substrate and including a solid electrode portion and a split electrode portion, said split electrode portion being continuously formed at an end of said solid electrode portion in a propagating direction of a surface acoustic wave generated on said piezoelectric substrate, said split electrode portion comprising a plurality of interdigitating electrode fingers which are meshed alternatively two by two, wherein an electrode interval between said split electrode portion and said solid electrode portion is about λ/8 and an electrode finger at an end of said solid electrode portion closest to said electrode interval has an electrode finger width of about $5\lambda/16$, where $\lambda$ is a wavelength of the surface acoustic wave.

2. A surface acoustic wave device comprising:

a piezoelectric substrate;

an interdigital transducer electrode disposed on said piezoelectric substrate and including a solid electrode portion and a split electrode portion, said split electrode portion being continuously formed at an end of said solid electrode portion in a propagating direction of a surface acoustic wave generated on said piezoelectric substrate, said split electrode portion comprising a plurality of interdigitating electrode fingers which are meshed alternatively two by two, wherein an electrode finger interval at a border between said solid electrode portion and said split electrode portion is about $3\lambda/16$, where $\lambda$ is a wavelength of the surface acoustic wave.

3. A surface acoustic wave device comprising:

a piezoelectric substrate;

a first surface acoustic wave transducer for excitation of a surface acoustic wave and a second surface acoustic wave transducer for receiving of the surface acoustic wave arranged in parallel on said piezoelectric substrate in a propagating direction of the surface acoustic wave, wherein an interdigital transducer electrode forming one of said first and second surface acoustic wave transducers is comprised of a solid electrode, and an interdigital transducer electrode forming the other of said first and second surface acoustic wave transducers includes a solid electrode portion and a split electrode portion continuously formed at an end of said solid electrode portion, said split electrode portion comprising a plurality of interdigitating electrode fingers which are meshed alternatively two by two, wherein an electrode interval between said split electrode portion and said solid electrode portion is about $\lambda/8$ and an electrode finger at an end of said solid electrode portion closest to said electrode interval has an electrode finger width of about $5\lambda/16$, where $\lambda$ is a wavelength of the surface acoustic wave.

4. A surface acoustic wave device comprising:

a piezoelectric substrate;

a first surface acoustic wave transducer for excitation of a surface acoustic wave and a second surface acoustic wave transducer for receiving of the surface acoustic wave arranged in parallel on said piezoelectric substrate in a propagating direction of the surface acoustic wave, wherein an interdigital transducer electrode forming one of said first and second surface acoustic wave transducers is comprised of a solid electrode, and an interdigital transducer electrode forming the other of said first and second surface acoustic wave transducers includes a solid electrode portion and a split electrode portion continuously formed at an end of said solid electrode portion, said split electrode portion comprising a plurality of interdigitating electrode fingers which are meshed alternatively two by two, wherein an electrode finger interval at a border between said solid electrode portion and said split electrode portion is about $3\lambda/16$, where $\lambda$ is a wavelength of the surface acoustic wave.

5. A surface acoustic wave device comprising:

a piezoelectric substrate;

an interdigital transducer electrode disposed on said piezoelectric substrate and including a solid electrode portion and a split electrode portion, said split electrode portion being continuously formed at an end of said electrode portion in a propagating direction of a surface acoustic wave generated on said piezoelectric substrate, an electrode interval between said split electrode portion and said solid electrode portion being about $\lambda/8$ and an electrode finger at an end of said solid electrode portion closest to said electrode interval having an electrode finger width of about five $\lambda/16$, wherein $\lambda$ is a wavelength of the surface acoustic wave.

6. A surface acoustic wave device comprising:

a piezoelectric substrate;

an interdigital transducer electrode disposed on said piezoelectric substrate and including a solid electrode portion and a split electrode portion, said split electrode portion being continuously formed at an end of said solid electrode portion in a propagating direction of a surface acoustic wave generated on said piezoelectric substrate, an electrode finger interval at a border between said solid electrode portion and said split electrode portion being about $3\lambda/16$, where $\lambda$ is a wavelength of the surface acoustic wave.

7. A surface acoustic wave device comprising:

a piezoelectric substrate;

a first surface acoustic wave transducer for excitation of a surface acoustic wave and a second surface acoustic wave transducer for receiving of the surface acoustic wave arranged in parallel on said piezoelectric substrate in a propagating direction of the surface acoustic wave, wherein an interdigital transducer electrode forming one of said first and second surface acoustic wave transducers is comprised of a solid electrode, and an interdigital transducer electrode forming the other of said first and second surface acoustic wave transducers includes a solid electrode portion and a split electrode portion continuously formed at an end of said solid electrode portion, an electrode interval between said split electrode portion and said solid electrode portion being about $\lambda/8$ and an electrode finger at an end of said solid electrode portion closest to said electrode interval has an electrode finger width of about $5\lambda/16$, where $\lambda$ is a wavelength of the surface of the acoustic wave.

8. A surface acoustic wave device comprising:

a piezoelectric substrate;

a first surface acoustic wave transducer for excitation of a surface acoustic wave and a second surface acoustic wave transducer for receiving of the surface acoustic wave arranged in parallel on said piezoelectric substrate in a propagating direction of the surface acoustic wave, wherein an interdigital transducer electrode forming one of said first and second surface acoustic wave transducers is comprised of a solid electrode, and an interdigital transducer electrode forming the other of said first and second surface acoustic wave transducers includes a solid electrode portion and a split electrode portion continuously formed at an end of said solid electrode portion, an electrode finger interval at a border between said solid electrode portion and said split electrode portion being about $3\lambda/16$, where $\lambda$ is a wavelength of the surface of the acoustic wave.

* * * * *